US007049894B1

(12) United States Patent  (10) Patent No.: US 7,049,894 B1
Aram  (45) Date of Patent: May 23, 2006

(54) AHUJA COMPENSATION CIRCUIT WITH ENHANCED BANDWIDTH

(75) Inventor: Farbod Aram, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 51 days.

(21) Appl. No.: 10/789,306

(22) Filed: Feb. 27, 2004

(51) Int. Cl.
    *H03G 3/10* (2006.01)

(52) U.S. Cl. .................. 330/296; 330/292; 330/294
(58) Field of Classification Search .............. 330/296, 330/292, 294, 260, 277, 253, 255
    See application file for complete search history.

(56) References Cited

U.S. PATENT DOCUMENTS

| 5,381,034 A | * | 1/1995 | Thrower et al. ............ 257/529 |
| 5,471,172 A | * | 11/1995 | Chiu et al. .................. 330/253 |
| 5,590,748 A | * | 1/1997 | Chang ...................... 190/18 A |
| 5,825,244 A | * | 10/1998 | Somayajula ................ 330/253 |
| 5,834,976 A | * | 11/1998 | Tomasini et al. ........... 330/292 |
| 6,369,554 B1 | * | 4/2002 | Aram ........................ 323/282 |
| 6,466,091 B1 | | 10/2002 | Kejariwal et al. |
| 6,515,540 B1 | | 2/2003 | Prasad et al. |
| 6,525,589 B1 | | 2/2003 | Thomsen et al. |
| 6,690,229 B1 | | 2/2004 | Rudolph |
| 6,756,847 B1 | * | 6/2004 | Blecker et al. ............. 330/253 |
| 6,803,803 B1 | * | 10/2004 | Starr et al. .................. 327/378 |

OTHER PUBLICATIONS

Bhupendra K. Ahuja, "An Improved Frequency Compensation Technique for CMOS Operational Amplifiers", IEEE Journal of Solid-State Circuits, vol. SC-18, No. 6, Dec. 1983, pp. 629-633.
U.S. Appl. No. 10/788,618, filed Feb. 27, 2004.
W. Grise, Dept. of IET, Morehead State University, Morehead, KY; Application of the Operational Transconductance Amplifier (OTA) to Voltage-controlled Amplifiers and Active Filters; 10 pages "No Month" "No Year".
Axel Thompsen, Dan Kasha, Wai Lee, Crystal Semiconductor Division, Cirrus Logic, Inc., Austin, Texas; A Five Stage Chopper Stablized Instrumentation Amplifier Using Feedforward Compensation; 1998; 4 pages "No Month".
Axel Thomsen, Edwin de Angel, Sherry Ziachong Wu, Aryesh Amar, Lei Wang, Wai Lee, WA 20.1 A DC Measurement IC with $130nV_{pp}$ Noise in 10Hz; 2000 IEEE International Solid-State Circuits Conference; 9 pages "No Month" "No Year".
Axel Thomsen, Edwin de Angel, Sherry Ziachong Wu, Aryesh Amar, Lei Wang, Wai Lee, WA 20.1 A DC Measurement IC with $130nV_{pp}$ Noise in 10Hz; ISSCC 2000/ Session 20/Oversampled Converters/ Paper WA 20.1 ISSCC 2000 Slide Supplement; 5 pages "No Month" "No Year".

(Continued)

*Primary Examiner*—Lam T. Mai

(57) ABSTRACT

An Ahuja compensation circuit includes a feedback loop with a high swing cascode biasing circuit. The high swing cascode biasing circuit includes a frequency boosting circuit. The frequency response of the high swing cascode biasing circuit and the Ahuja compensation circuit are improved by the frequency boosting circuit.

38 Claims, 7 Drawing Sheets

OTHER PUBLICATIONS

M.Moyal, M. Groepl, H. Werker, G. Mitteregger, J. Schambacher; Xignal Technologies AG, Munich, Germany; 23.6 A 700/900mW/Channel CMOS Dual Analog Front-End IC for VDSL with integrated 11.5/14.5dBm Line Drivers; 2003 IEEE International Solid-State Circuits Conference; ISSCC 2003/Session 23/Mixed-Signal and Wireline Techniques; 10 pages "No Month".

M. Moyal, M. Groepl, H. Werker, G. Mitteregger, J. Schambacher; Xignal Technologies AG, Munich, Germany; A 700/900mW/Channel CMOS Dual Analog Front-End IC for VDSL with Integrated 11.5/14.5dBm Line Drivers; Outline, Overview 24 pages "No Month" "No Year".

U.S. Appl. No. 10/788,618, filed Feb. 27, 2004, Aram, Farbod

U.S. Appl. No. 11/097,530, filed Apr. 1, 2005, Aram, Farbod

U.S. Appl. No. 11/170,926, filed Jun. 30, 2005, Aram, Farbod

* cited by examiner

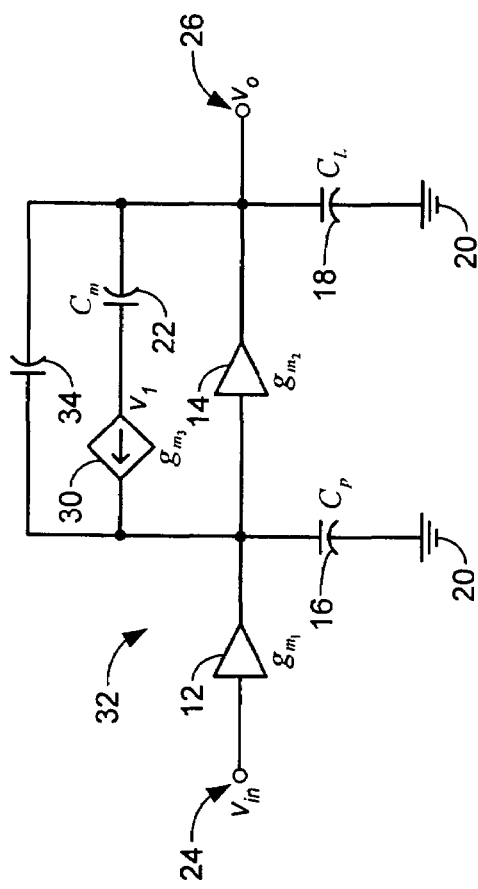
FIG. 2D
_Prior Art_

AHUJA COMPENSATION CIRCUIT WITH ENHANCED BANDWIDTH

CROSS-REFERENCE TO RELATED APPLICATIONS

This application is related to "Frequency Boosting Circuit for High Swing Cascode Biasing Circuits", U.S. patent application Ser. No. 10/788,618, filed Feb. 27, 2004, which is hereby incorporated by reference in its entirety.

FIELD OF THE INVENTION

The present invention relates to frequency compensation circuits, and more particularly to Ahuja compensation circuits with high swing cascode biasing circuits.

BACKGROUND OF THE INVENTION

Miller compensation is a conventional frequency compensation technique that involves the movement of a dominant pole of a gain stage to a lower frequency by increasing the effective input capacitance of the gain stage. Miller compensation circuits include a Miller capacitor that exploits the Miller effect. When the Miller capacitor is connected across an input and an output of an amplifier, the capacitance appears much larger from the input of the amplifier. While the dominant pole may be moved to a lower frequency using this approach, bandwidth of the system is still limited.

Referring now to FIG. 1, a Miller compensation circuit 10 includes first and second amplifiers 12 and 14, respectively. An output of the first amplifier 12 communicates with an input of the second amplifier 14. A first end of a first capacitor 16 (or parasitic capacitance) communicates with the input of the second amplifier 14. A first end of a second capacitor 18 (or load capacitance) communicates with an output of the second amplifier 14. Second ends of the first and second capacitors 16 and 18, respectively, communicate with a ground potential 20. A first end of a third capacitor 22 (or compensating capacitance) communicates with the input of the second amplifier 14. A second end of the third capacitor 22 communicates with the output of the second amplifier 14.

An input voltage 24, $v_{in}$, of the Miller compensation circuit 10 is applied to an input of the first amplifier 12. An output voltage 26, $v_{out}$, of the Miller compensation circuit 10 is referenced from the output of the second amplifier 14. The transconductance, $g_{m_2}$, of the second amplifier 14 may be increased to increase the overall bandwidth.

Referring now to FIGS. 2A and 2B, there are two conventional ways to increase the transconductance of the second amplifier 14. In FIG. 2A, a voltage gain device 28 is used in the feed forward path to increase the transconductance. An input of the voltage gain device 28 communicates with the first ends of the first and third capacitors 16 and 22, respectively, and the output of the first amplifier 12. An output of the voltage gain device 28 communicates with the input of the second amplifier 14.

In FIG. 2B, a current gain device 30 is used in the feedback path to increase the transconductance. An input of the current gain device 30 communicates with the first end of the third capacitor 22. An output of the current gain device 30 communicates with the output of the first amplifier 12, the input of the second amplifier 14, and the first end of the first capacitor 16. An Ahuja compensation circuit 32 is created by adding the current gain device 30 in the feedback path. A transconductance, $g_{m_3}$, is associated with the current gain device 30.

While both the voltage gain device 28 in FIG. 2A and the current gain device 30 in FIG. 2B increase the transconductance of the second amplifier 14, both arrangements also generate a new pole. Poles tend to limit the bandwidth of a circuit. Therefore, there is a cost associated with increasing the transconductance of the second amplifier 14. In the case of the current gain device 30 in FIG. 2B, a pole is generated that is associated with the current gain device 30 and the third capacitor 22. The pole is equal to $$\frac{g_{m_3}}{C_m},$$

where $g_{m_3}$ is the transconductance of the current gain device 30 and $C_m$ is the capacitance of the third capacitor 22.

The following discussion sets forth the bandwidth of the circuit in FIG. 2B. In order to derive the bandwidth, an open loop response technique is used. The open loop response technique provides information relating to the bandwidth and maximum achievable bandwidth of a circuit. The DC gain of the open loop response is determined by opening the feedback loop at the output of the amplifier and attaching a voltage source to one end of the opened feedback loop. The output voltage is sensed at the other end (corresponding to the output of the amplifier) of the opened feedback loop.

To derive the bandwidth, the DC gain of the open loop response and the first dominant pole $P_1$ are found. Assuming stable operation, there is only one pole $P_1$ that is located below a crossover frequency. The crossover frequency is the product of the DC gain of the open loop response and the first dominant pole $P_1$. The crossover frequency defines the bandwidth of the closed loop amplifier. The maximum available bandwidth is related to the second non-dominant pole $P_2$.

Referring now to FIG. 2C, the open loop response of the circuit of FIG. 2B is shown. Initially, the open loop response of the second amplifier stage will be considered. When the open loop response technique is employed, the feedback loop is opened between the capacitance $C_m$ and the output of the second amplifier 14. The input voltage is applied to the disconnected end of the capacitance $C_m$ and the output voltage is taken at the output of the second amplifier 14. At DC, the capacitance is an open circuit. Therefore the gain is usually considered at a mid-frequency as shown in FIG. 2C. The gain at mid-frequency is $$g_{m2} R_{o2} \left( \frac{C_m}{C_p} \right)$$

and the first dominant pole occurs at $$\frac{1}{R_{o2}(C_L + C_m)}$$

for the second stage. Multiplying the gain of the open loop response with the dominant pole $P_1$ results in the crossover frequency of $$\frac{g_{m_2}}{C_L + C_m}\left(\frac{C_m}{C_p}\right)$$

for the second stage. Further the second stage has a first non-dominant pole at $$\frac{g_{m_3}}{C_m},$$

which relates to a barrier frequency or maximum achievable bandwidth.

The unity bandwidth or crossover frequency of the second stage is equivalent to the first non-dominant pole of the main loop including the first amplifier 12. As described above, the first non-dominant pole defines a barrier frequency or maximum achievable bandwidth of the circuit. Therefore, the circuit in FIG. 2B has a frequency response that is limited to $$\frac{g_{m_2}}{C_L + C_m}\left(\frac{C_m}{C_p}\right),$$

which is undesirable.

Referring now to FIG. 2D, in one approach, a fourth capacitor 34 that may be added to the Ahuja frequency compensation circuit 32. A first end of the fourth capacitor 34 communicates with the input of the second amplifier 14 and a second end of the fourth capacitor 34 communicates with the output of the second amplifier 14. However, while the arrangement in FIG. 2D may be utilized to adjust the non-dominant pole, the non-dominant pole still creates a limitation on the overall bandwidth of the system. The addition of the zero improves the frequency response slightly and alleviates the phase margin of the internal loop.

Alternatively, the transconductance of the current gain device 30 may be increased to increase the frequency of the non-dominant pole. However, conventional methods for increasing the transconductance of the current gain device 30 usually increase power consumption and/or require additional components.

SUMMARY OF THE INVENTION

An Ahuja compensation circuit includes first and second transistors and first, second, and third capacitances. A second terminal of the first transistor communicates with a control terminal of the second transistor. A first end of the first capacitance communicates with the second terminal of the first transistor. A first end of the second capacitance communicates with a first terminal of the second transistor. A second end of the third capacitance communicates with the first terminal of the second transistor. A high swing cascode biasing circuit communicates with the second terminal of the first transistor and a first end of the third capacitance. The high swing cascode biasing circuit includes a current biasing circuit that generates a cascode bias and a main bias. A frequency boosting circuit receives the cascode bias and the main bias. A current mirror circuit receives the main bias.

In other features, feedback is used to increase a transconductance of the high swing cascode biasing circuit. The current mirror circuit comprises third and fourth transistors. A second terminal of the third transistor communicates with a first terminal of the fourth transistor. A first terminal of the third transistor communicates with the control terminal of the second transistor. The second terminal of the third transistor communicates with the first end of the third capacitance.

In still other features, the current biasing circuit comprises fifth, sixth, seventh, and eighth transistors each having a first terminal, a second terminal, and a control terminal. The second terminals of the fifth and seventh transistors communicate with the first terminals of the sixth and eighth transistors, respectively. The control terminals of the fifth and sixth transistors communicate. The first terminal of the fifth transistor communicates with the control terminal of the seventh transistor, and the control terminal of the eighth transistor communicates with the first terminal of the seventh transistor.

In yet other features, control terminals of the third and fourth transistors communicate with the control terminals of the seventh and eighth transistors, respectively. The current biasing circuit further comprises a fourth capacitance having a first end that communicates with the second terminal of the fifth transistor.

In other features, the frequency boosting circuit comprises a resistance having a first end that communicates with the first terminal of the fifth transistor and a second end that communicates with the control terminal of the fifth transistor. A fourth capacitance has a first end that communicates with the second end of the resistance and a second end that communicates with the second terminal of the third transistor. The first, second, third, fourth, fifth, sixth, seventh, and eighth transistors are metal-oxide semiconductor field-effect transistors (MOSFETs). The resistance is one of a standard fixed-value resistor, a nonlinear resistor, and a metal-oxide semiconductor (MOS) resistor. The first terminals of the fifth and seventh transistors communicate with first and second current sources, respectively. An input voltage of the Ahuja compensation circuit is applied to a control terminal of the first transistor. An output voltage of the Ahuja compensation circuit is referenced from the first terminal of the second transistor.

A feedback loop in an Ahuja compensation circuit includes a first transistor and a first capacitance having a first end that communicates with a first terminal of the first transistor. A high swing cascode biasing circuit communicates with a second end of the first capacitance and a control terminal of the first transistor and includes a current biasing circuit that generates a cascode bias and a main bias. A frequency boosting circuit receives the cascode bias and the main bias. A current mirror circuit receives the main bias. The frequency boosting circuit biases the current mirror circuit based on feedback from the current mirror circuit.

In other features, the current mirror circuit comprises second and third transistors. A second terminal of the second transistor communicates with a first terminal of the third transistor. A first terminal of the second transistor communicates with the control terminal of the first transistor. The second terminal of the second transistor communicates with the first end of the first capacitance.

In still other features, the current biasing circuit comprises fourth, fifth, sixth, and seventh transistors each having a first terminal, a second terminal, and a control terminal. The second terminals of the fourth and sixth transistors communicate with the first terminals of the fifth and seventh transistors, respectively. The control terminal of the fourth transistor communicates with the control terminal of the fifth transistor. The first terminal of the fourth transistor communicates with the control terminal of the sixth transistor. The control terminal of the seventh transistor communicates with the first terminal of the sixth transistor.

In other features, control terminals of the second and third transistors communicate with the control terminals of the sixth and seventh transistors, respectively. The current biasing circuit further comprises a second capacitance having a first end that communicates with the second terminal of the fourth transistor. The frequency boosting circuit comprises a resistance having a first end that communicates with the first terminal of the fourth transistor and a second end that communicates with the control terminal of the fourth transistor. A second capacitance has a first end that communicates with the second end of the resistance and a second end that communicates with the second terminal of the second transistor. The first, second, third, fourth, fifth, sixth, and seventh transistors are metal-oxide semiconductor field-effect transistors (MOSFETs). The resistance is one of a standard fixed-vale resistor, a nonlinear resistor, and a metal-oxide semiconductor (MOS) resistor.

In still other features, a system comprises the feedback loop and further comprises an Ahuja compensation circuit including the first transistor and a second transistor. A second terminal of the second transistor communicates with the control terminal of the first transistor. An input voltage of the system is applied to a control terminal of the second transistor. An output voltage of the system is referenced from the first terminal of the first transistor.

In still other features, the Ahuja compensation circuit comprises second and third capacitances. A first end of the second capacitance communicates with the control terminal of the first transistor. The first end of the third capacitance communicates with the first terminal of the first transistor.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 2D is an electrical schematic of an Ahuja compensation circuit that includes a capacitor in parallel with an amplifier for adjusting a non-dominant pole according to the prior art;

DETAILED DESCRIPTION OF THE PREFERRED EMBODIMENTS

Figure 1:
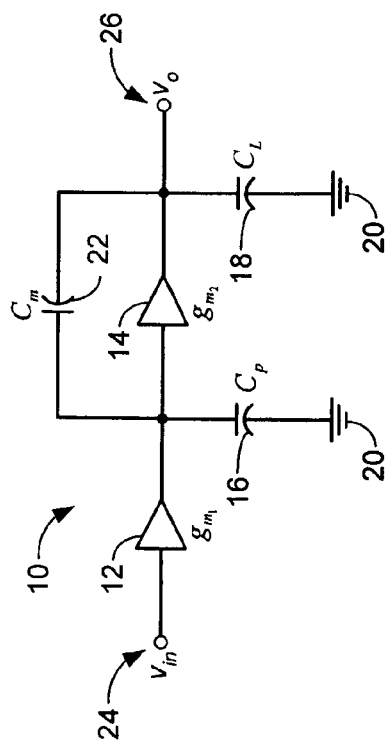
FIG. 1 is an electrical schematic of a Miller compensation circuit according to the prior art.
Figure 2A:
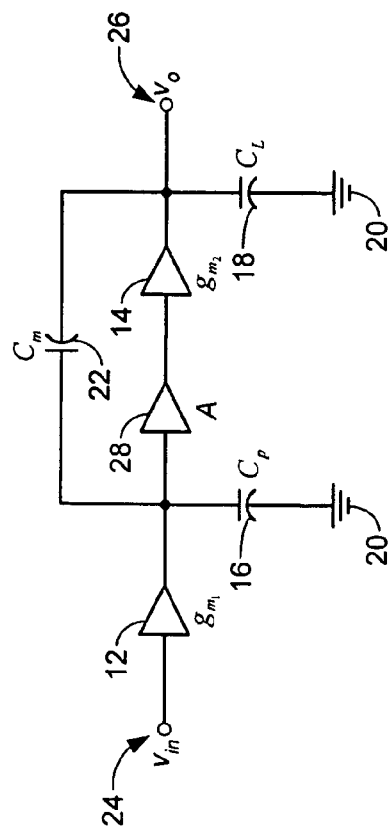
FIG. 2A is an electrical schematic of a Miller compensation circuit that includes a voltage gain device in the feed forward path according to the prior art.
Figure 2B:
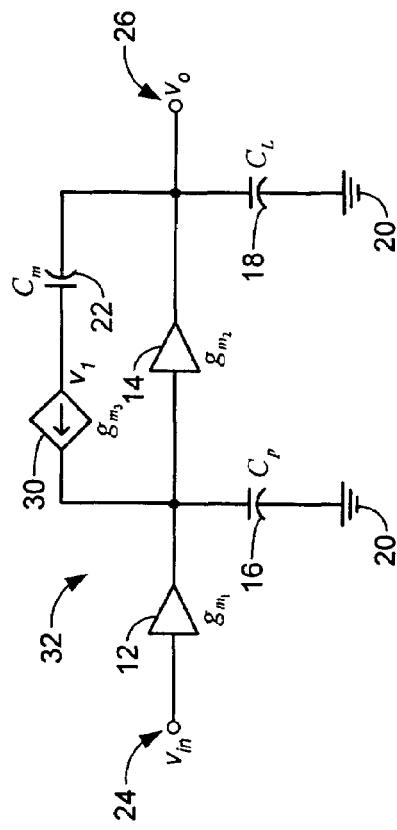
FIG. 2B is an electrical schematic of an Ahuja compensation circuit that includes a current gain device in the feedback path according to the prior art.
Figure 2C:
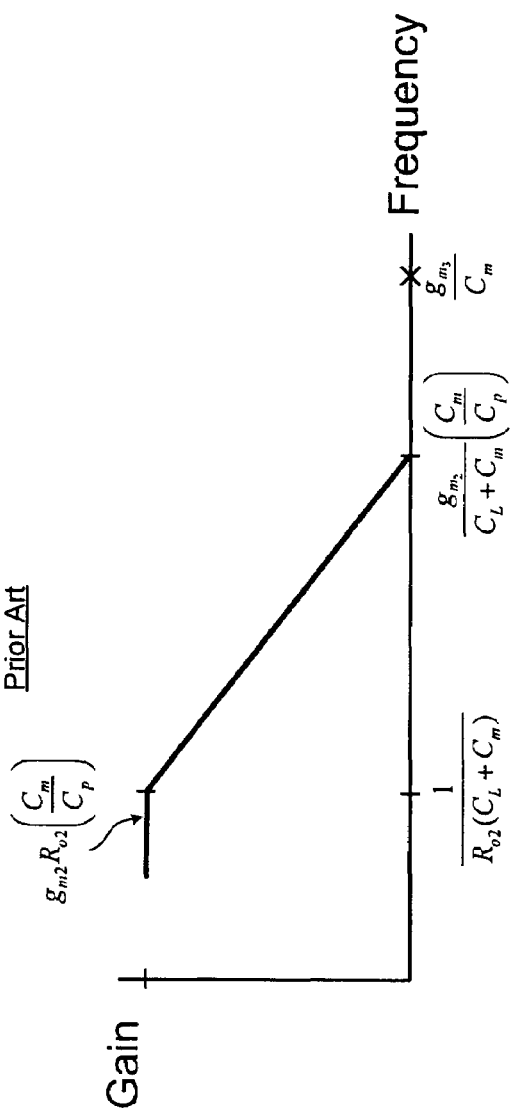
FIG. 2C illustrates the open loop response of a second amplifier stage for the Ahuja compensation circuit in FIG. 2B according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 3:
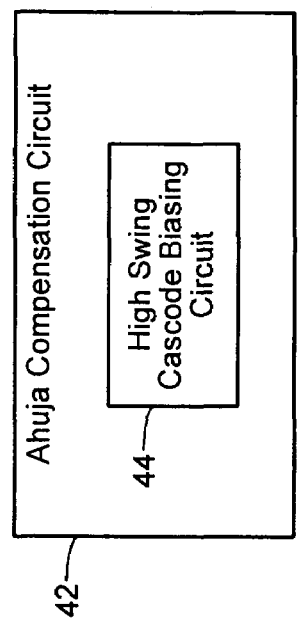
FIG. 3 is a functional block diagram of an Ahuja compensation circuit that includes a high swing cascode biasing circuit with a frequency boosting circuit according to the present invention.
Figure 4:
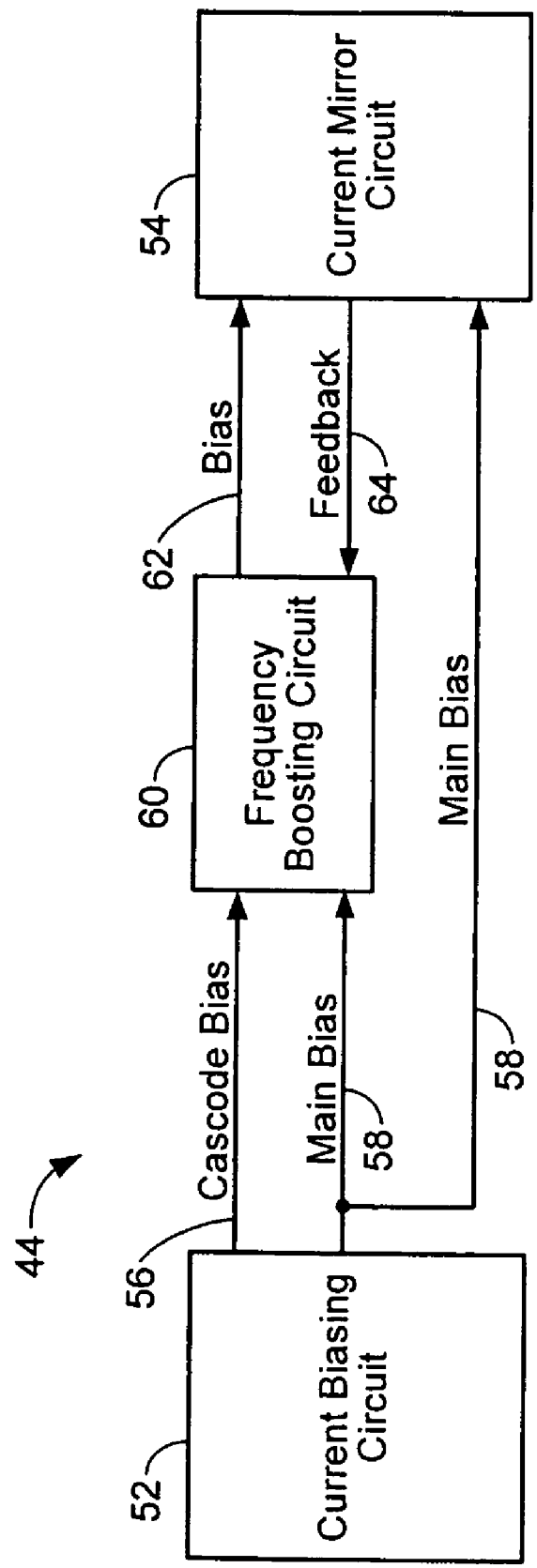
FIG. 4 is a functional block diagram of the high swing cascode biasing circuit and the frequency boosting circuit of FIG. 3.

Referring now to FIGS. 3 and 4, an Ahuja compensation circuit 42 that utilizes a high swing cascode biasing circuit 44 is shown. In FIG. 4, one implementation of the high swing cascode biasing circuit 44 is illustrated in further detail and includes a biasing circuit 52 and a current mirror circuit 54. The biasing circuit 52 generates a cascode bias 56 and a main bias 58. The high swing cascode biasing circuit 44 also includes a frequency boosting circuit 60 that receives the cascode bias 56 and the main bias 58 from the biasing circuit 52. The frequency boosting circuit 60 provides a bias signal 62 to and receives a feedback signal 64 from the current mirror circuit 54. The current mirror circuit 54 also receives the main bias 58 from the biasing circuit 52.

Figure 5A:
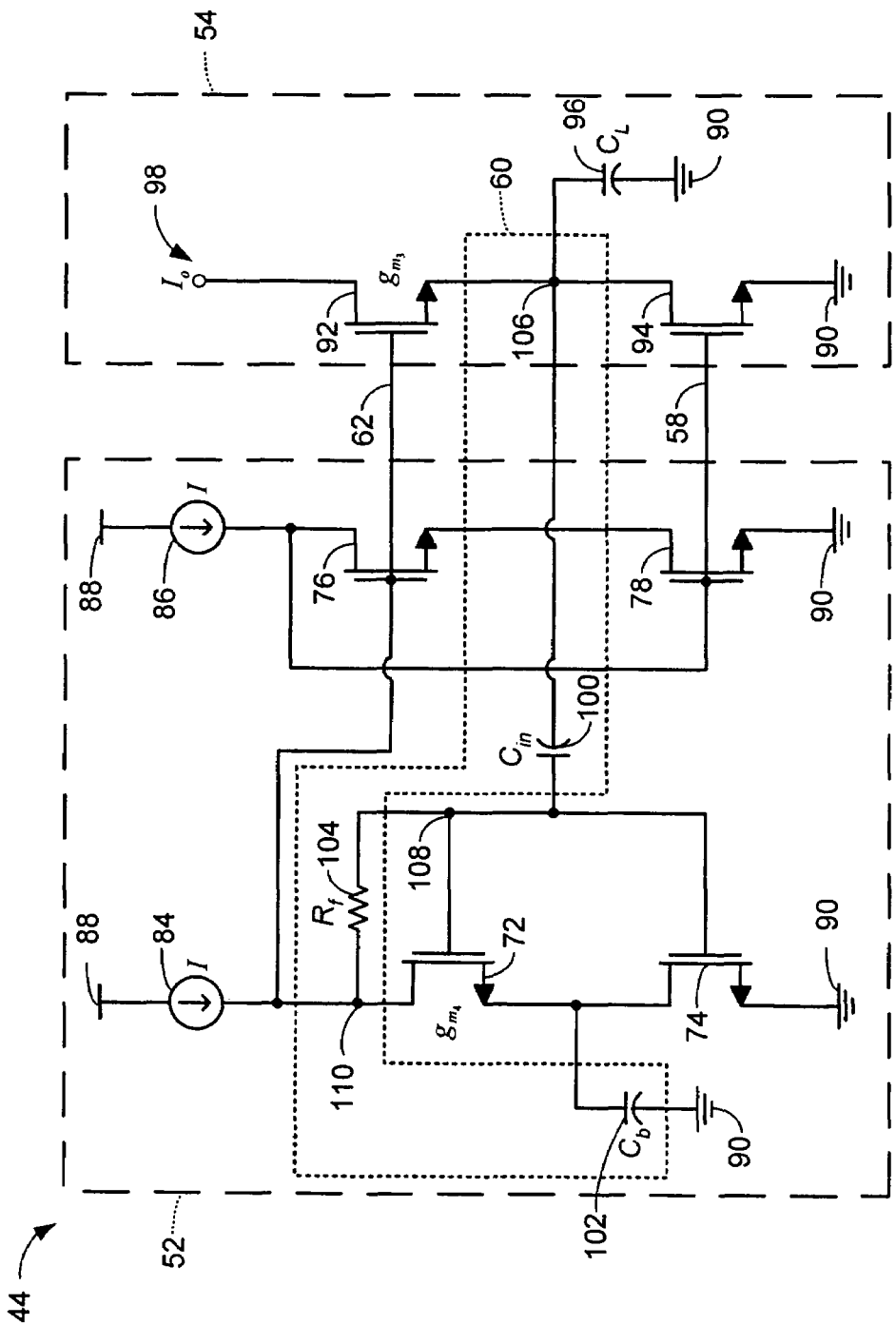
FIG. 5A is an electrical schematic of the high swing cascode biasing circuit and the frequency boosting circuit of FIG. 4 in further detail.

Referring now to FIG. 5A, the biasing circuit 52 includes first, second, third, and fourth transistors 72, 74, 76, and 78, respectively. In this implementation, the first, second, third, and fourth transistors 72, 74, 76, and 78, respectively, are metal-oxide semiconductor field-effect transistors (MOSFETs) that have gates, sources, and drains, although other transistor types may be used. Sources (or second terminals) of the first and third transistors 72 and 76, respectively, communicate with drains (or first terminals) of the second and fourth transistors 74 and 78, respectively. A gate (or control terminal) of the second transistor 74 communicates with a gate of the first transistor 72. A gate of the fourth transistor 78 communicates with a drain of the third transistor 76, and a drain of the first transistor 72 communicates with a gate of the third transistor 76. The drains of the first and third transistors 72 and 76, respectively, communicate with first and second current sources 84 and 86, respectively. The first and second current sources 84 and 86, respectively, communicate with a supply potential 88. Sources of the second and fourth transistors 74 and 78, respectively, communicate with a ground potential 90.

The current mirror circuit 54 includes fifth and sixth transistors 92 and 94, respectively. A source of the fifth transistor 92 communicates with a drain of the sixth transistor 94. The gate of the third transistor 76 communicates with a gate of the fifth transistor 92. The gate of the fourth transistor 78 communicates with a gate of the sixth transistor 94. A first end of a first capacitor 96 communicates with the source of the fifth transistor 92. A second end of the first capacitor 96 and a source of the sixth transistor 94 communicate with the ground potential 90. A load current 98 flows into the drain of the fifth transistor 92.

The frequency boosting circuit 60 includes a second capacitor 100, a third capacitor 102, and a resistor 104. The resistor 104, $R_f$, is connected between the gate of the first transistor 72 and the drain of the first transistor 72. The gate of the first transistor 72 is capacitively coupled by the second capacitor 100, $C_{in}$, to an output node 106. For example, the second capacitor 100 may be a metal-insulator-metal (MIM) capacitor, a metal-oxide semiconductor (MOS) capacitor, or any other type of capacitor. The output node 106 additionally connects the source of the fifth transistor 92, the first end of the first capacitor 96, and the drain of the sixth transistor 94. The third capacitor 102, $C_b$, has one end that is connected to the source of the first transistor 72 and the drain of the second transistor 74 and an opposite end that is connected to the ground potential 90.

The second and third capacitors 100 and 102, respectively, function as open-circuits during low frequency operation. Very little current flows to the gates of the transistors during low frequency operation. Therefore, little or no current flows through the resistor 104 and the voltage drop across the resistor 104 is approximately zero.

The configuration of the first transistor 72 and the resistor 104 in the frequency boosting circuit 60 creates an amplifier with a feedback resistor. A node 108 at the second end of the resistor 104 and the gate of the first transistor 72 is an input to the amplifier. A node 110 at the first end of the resistor 104 and the drain of the first transistor 72 is the output of the amplifier. The feedback path increases the overall bandwidth of the high swing cascode biasing circuit 44.

The second and third capacitors 100 and 102, respectively, are effectively short circuits during high frequency operation. The third capacitor 102 bypasses the second transistor 74 during high frequency operation. The second capacitor 100 creates a path from the gate of the first transistor 72 to the source of the fifth transistor 92. The third capacitor 102 does not generate an internal pole. If the frequency boosting circuit 60 is implemented in a differential amplifier, the third capacitor 102 may be omitted.

Figure 5B:
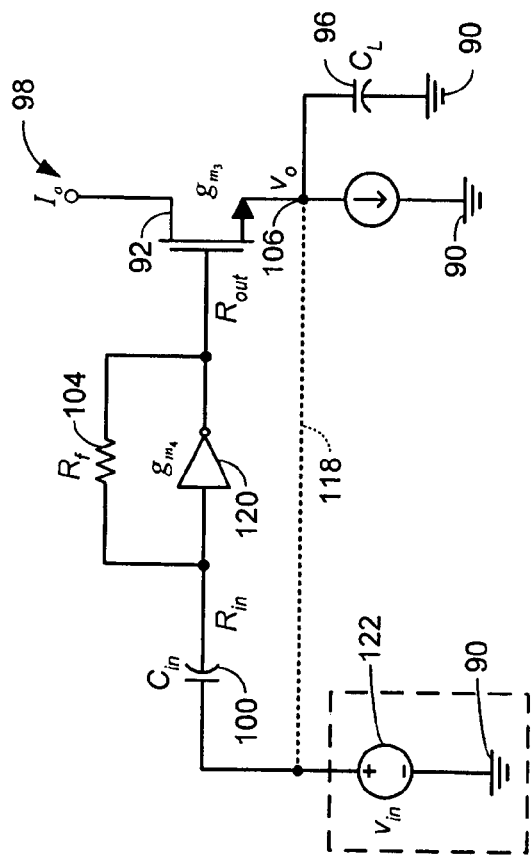
FIG. 5B is an equivalent circuit of the high swing cascode biasing circuit of FIG. 5A that illustrates open-loop and closed-loop responses.

Referring now to FIG. 5B, an equivalent open loop and closed loop circuit of the high swing cascode biasing circuit 44 of FIG. 5A is shown. A dotted line 118 indicates a closed feedback loop. The equivalent circuit includes an inverting amplifier 120. Little or no current enters the inverting amplifier 120 during low frequency operation due to the second capacitor 100 effectively operating as an open circuit.

During high frequency operation, the second capacitor 100 functions as a short-circuit and current flows to the inverting amplifier 120. The inverting amplifier 120 has an input impedance and an output impedance. The input impedance is equal to $$R_{in} = \frac{1}{g_{m_4}}\left(1 + \left(\frac{R_f}{R_{out}}\right)\right).$$

Since the output impedance of the inverting amplifier is very large, the input impedance is approximately equal to $$R_{in} = \frac{1}{g_{m_4}}.$$

A voltage source 122 generates current at an input of the inverting amplifier 120. The current is equal to the voltage divided by the input impedance of the inverting amplifier 120. During high frequency operation, the impedance of the second capacitor 100 becomes very small as compared to the input impedance of the inverting amplifier 120. Therefore, the current that enters the inverting amplifier 120 during high frequency operation is equal to $$\frac{v_{in}}{\left(\frac{1}{g_{m_4}}\right)} = v_{in}g_{m_4}.$$

A voltage drop across the resistor 104 is equal to $v_{in}g_{m_4}R_f$. This voltage, $v_{in}g_{m_4}R_f$, appears at the output node 106. Current flows from the resistor 104 to the fifth transistor 92. The size of the resistor 104, $R_f$, is preferably larger than $$\frac{1}{g_{m_4}}.$$

Figure 5C:
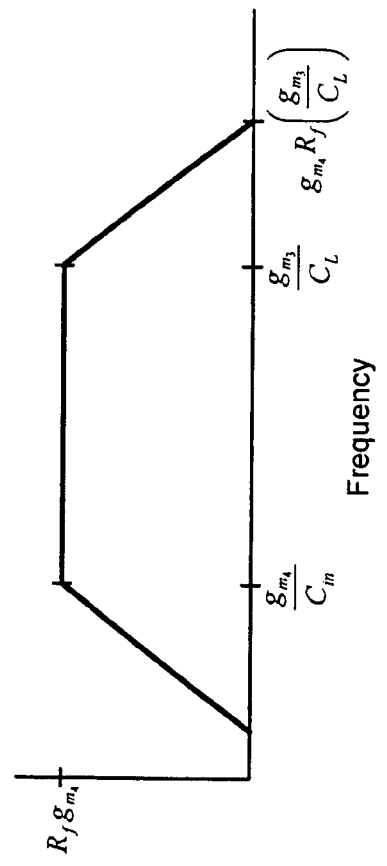
FIG. 5C illustrates the open loop response of the high swing cascode biasing circuit in FIG. 5A.

Referring now to FIG. 5C, the open loop response technique is utilized to characterize the bandwidth of the system. The DC gain of the open loop response is equal to $R_f g_{m_4}$ and a dominant pole occurs at $$\frac{g_{m_3}}{C_L}.$$

Therefore, the crossover frequency is equal to $$g_{m_4} R_f \left(\frac{g_{m_3}}{C_L}\right).$$

In other words, the pole $$\frac{g_{m_3}}{C_L}$$

is moved upwards in frequency by the gain $R_f g_{m_4}$. There is also sufficient separation between all other poles and the crossover frequency. When the feedback loop is closed by the second capacitor 100, the transconductance, $g_{m_3}$, of the fifth transistor 92 is significantly increased.

Figure 6:
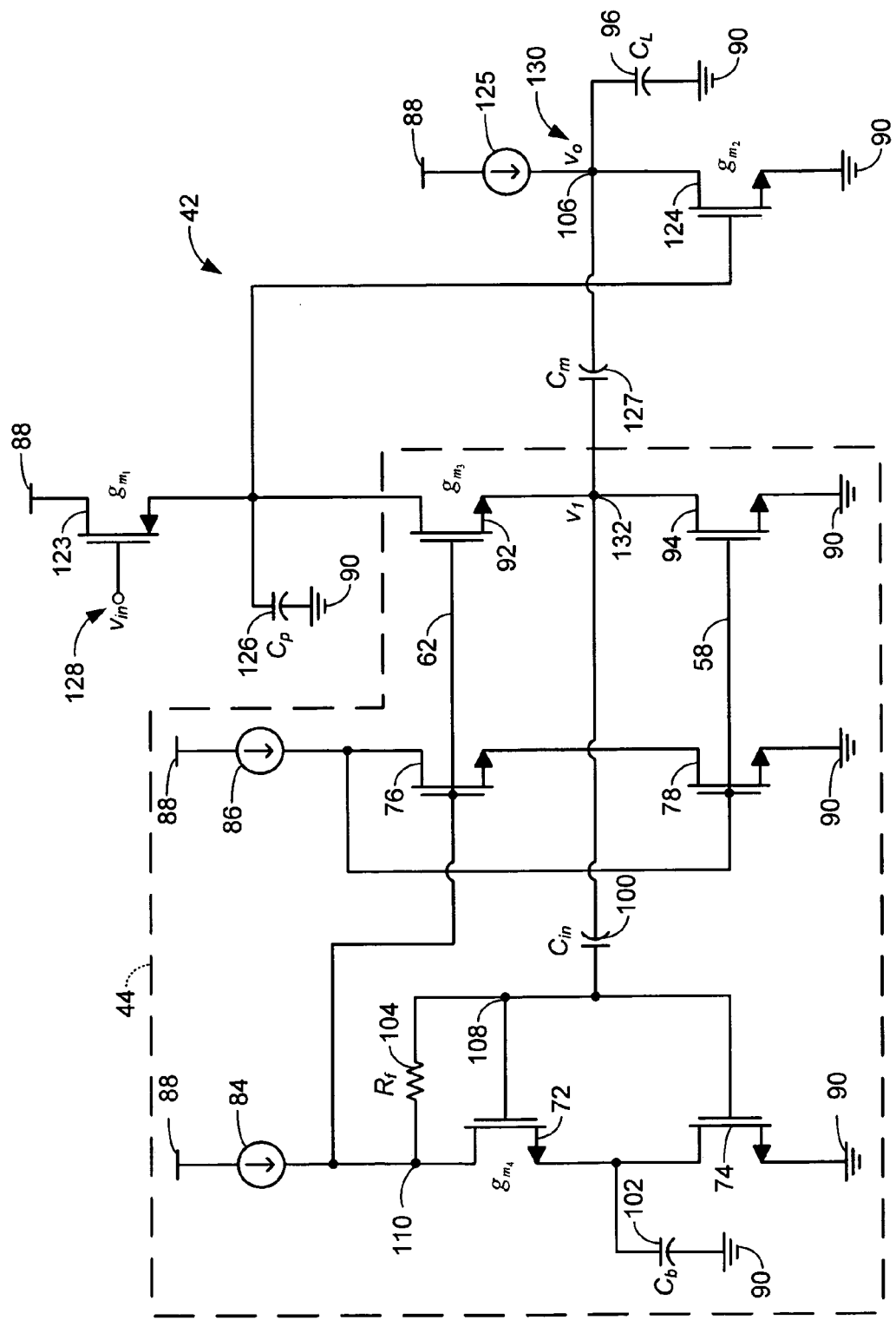
FIG. 6 is an electrical schematic of an Ahuja compensation circuit that includes the high swing cascode biasing circuit in FIG. 5A.

Referring now to FIG. 6, the high swing cascode biasing circuit 44 is implemented as a current gain device in the Ahuja compensation circuit 42. The Ahuja compensation circuit 42 includes seventh and eighth transistors 123 and 124, respectively. A source of the seventh transistor 123 communicates with a gate of the eighth transistor 124 and the drain of the fifth transistor 92. A drain of the eighth transistor 124 communicates with a third current source 125.

The third current source 125 and the drain of the seventh transistor 123 communicate with the supply potential 88. A first end of a fourth capacitor 126 communicates with the source of the seventh transistor 123. The first end of the first capacitor 96 communicates with the drain of the eighth transistor 124. A second end of the fourth capacitor 126 and a source of the eighth transistor 124 communicate with the ground potential 90. The source of the fifth transistor 92 is coupled by a fifth capacitor 127 to the drain of the eighth transistor 124.

An input voltage 128, $V_{in}$, enters a gate of the seventh transistor 123, and an output voltage 130, $v_o$, is referenced from the output node 106. A node voltage 132, $v_1$, is referenced from a node between the source of the fifth transistor 92 and the drain of the sixth transistor 94.

The third capacitor 102 functions effectively as a short circuit during high frequency operation and bypasses the second transistor 74. This prevents an additional pole from occurring in the high swing cascode biasing circuit 44. As discussed above, if the high swing cascode biasing circuit 44 is differential, the third capacitor 102 may be omitted. The Ahuja compensation circuit 42 of the present invention is particularly applicable to analog-to-digital (A/D) applications and regulators. However, those skilled in the art can appreciate that the Ahuja compensation circuit 42 of the present invention is applicable in other circuits.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. An Ahuja compensation circuit, comprising:
   first and second transistors, wherein a second terminal of said first transistor communicates with a control terminal of said second transistor;
   first, second, and third capacitances, wherein a first end of said first capacitance communicates with said second terminal of said first transistor, a first end of said second capacitance communicates with a first terminal of said second transistor, and a second end of said third capacitance communicates with said first terminal of said second transistor, and
   a high swing cascode biasing circuit that communicates with said second terminal of said first transistor and a first end of said third capacitance and that includes:
      a current biasing circuit that generates a cascode bias and a main bias;
      a frequency boosting circuit that receives said cascode bias and said main bias; and
      a current mirror circuit that receives said main bias.

2. The Ahuja compensation circuit of claim 1 wherein feedback is used to increase a transconductance of said high swing cascode biasing circuit.

3. The Ahuja compensation circuit of claim 1 wherein said current mirror circuit comprises:
   third and fourth transistors, wherein a second terminal of said third transistor communicates with a first terminal of said fourth transistor, a first terminal of said third transistor communicates with said control terminal of said second transistor, and said second terminal of said third transistor communicates with said first end of said third capacitance.

4. The Ahuja compensation circuit of claim 3 wherein said current biasing circuit comprises:
   fifth, sixth, seventh, and eighth transistors each having a first terminal, a second terminal, and a control terminal, wherein said second terminals of said fifth and seventh transistors communicate with said first terminals of said sixth and eighth transistors, respectively, said control terminals of said fifth and sixth transistors communicate, said first terminal of said fifth transistor communicates with said control terminal of said seventh transistor, and said control terminal of said eighth transistor communicates with said first terminal of said seventh transistor.

5. The Ahuja compensation circuit of claim 4 wherein control terminals of said third and fourth transistors communicate with said control terminals of said seventh and eighth transistors, respectively.

6. The Ahuja compensation circuit of claim 4 wherein said current biasing circuit further comprises a fourth capacitance having a first end that communicates with said second terminal of said fifth transistor.

7. The Ahuja compensation circuit of claim 4 wherein said frequency boosting circuit comprises:
   a resistance having a first end that communicates with said first terminal of said fifth transistor and a second end that communicates with said control terminal of said fifth transistor; and
   a fourth capacitance having a first end that communicates with said second end of said resistance and a second end that communicates with said second terminal of said third transistor.

8. The Ahuja compensation circuit of claim 4 wherein said first, second, third, fourth, fifth, sixth, seventh, and eighth transistors are metal-oxide semiconductor field-effect transistors (MOSFETs).

9. The Ahuja compensation circuit of claim 8 wherein said resistance is one of a standard fixed-value resistor, a non-linear resistor, and a metal-oxide semiconductor (MOS) resistor.

10. The Ahuja compensation circuit of claim 4 wherein said first terminals of said fifth and seventh transistors communicate with first and second current sources, respectively.

11. The Ahuja compensation circuit of claim 1 wherein an input voltage of said Ahuja compensation circuit is applied to a control terminal of said first transistor and wherein an output voltage of said Ahuja compensation circuit is referenced from said first terminal of said second transistor.

12. The Ahuja compensation circuit of claim 1 wherein said first terminal of said second transistor communicates with a current source.

13. A feedback loop in an Ahuja compensation circuit, comprising:
   a first transistor;
   a first capacitance having a first end that communicates with a first terminal of said first transistor; and
   a high swing cascode biasing circuit that communicates with a second end of said first capacitance and a control terminal of said first transistor and that includes:
      a current biasing circuit that generates a cascode bias and a main bias;
      a frequency boosting circuit that receives said cascode bias and said main bias; and
      a current mirror circuit that receives said main bias.

14. The feedback loop of claim 13 wherein said current mirror circuit comprises:

second and third transistors, wherein a second terminal of said second transistor communicates with a first terminal of said third transistor, a first terminal of said second transistor communicates with said control terminal of said first transistor, and said second terminal of said second transistor communicates with said first end of said first capacitance.

15. The feedback loop of claim 14 wherein said current biasing circuit comprises:
fourth, fifth, sixth, and seventh transistors each having a first terminal, a second terminal, and a control terminal, wherein said second terminals of said fourth and sixth transistors communicate with said first terminals of said fifth and seventh transistors, respectively, said control terminal of said fourth transistor communicates with said control terminal of said fifth transistor, said first terminal of said fourth transistor communicates with said control terminal of said sixth transistor, and said control terminal of said seventh transistor communicates with said first terminal of said sixth transistor.

16. The feedback loop of claim 15 wherein control terminals of said second and third transistors communicate with said control terminals of said sixth and seventh transistors, respectively.

17. The feedback loop of claim 15 wherein said current biasing circuit further comprises a second capacitance having a first end that communicates with said second terminal of said fourth transistor.

18. The feedback loop of claim 15 wherein said frequency boosting circuit comprises:
a resistance having a first end that communicates with said first terminal of said fourth transistor and a second end that communicates with said control terminal of said fourth transistor; and
a second capacitance having a first end that communicates with said second end of said resistance and a second end that communicates with said second terminal of said second transistor.

19. The feedback loop of claim 15 wherein said first, second, third, fourth, fifth, sixth, and seventh transistors are metal-oxide semiconductor field-effect transistors (MOSFETs).

20. The feedback loop of claim 18 wherein said resistance is one of a standard fixed-value resistor, a nonlinear resistor, and a metal-oxide semiconductor (MOS) resistor.

21. The feedback loop of claim 15 wherein said first terminals of said fourth and sixth transistors communicate with first and second current sources, respectively.

22. A system comprising the feedback loop of claim 13 and further comprising an Ahuja compensation circuit including said first transistor and a second transistor, wherein a second terminal of said second transistor communicates with said control terminal of said first transistor.

23. The system of claim 22 wherein an input voltage of said system is applied to a control terminal of said second transistor and wherein an output voltage of said system is referenced from said first terminal of said first transistor.

24. The system of claim 22 wherein said Ahuja compensation circuit comprises second and third capacitances, wherein a first end of said second capacitance communicates with said control terminal of said first transistor and wherein said first end of said third capacitance communicates with said first terminal of said first transistor.

25. The feedback loop of claim 13 wherein said first terminal of said first transistor communicates with a first current source.

26. A feedback loop in an Ahuja compensation circuit, comprising:
a first transistor;
first capacitance means for providing a first capacitance and having a first end that communicates with a first terminal of said first transistor; and
high swing cascode biasing means for communicating with a second end of said first capacitance means and a control terminal of said first transistor and that includes:
current biasing means for generating a cascode bias and a main bias;
frequency boosting means for receiving said cascode bias and said main bias and for boosting a frequency response of said high swing cascode biasing means; and
current mirror means for receiving said main bias.

27. The feedback loop of claim 26 wherein said current mirror means comprises:
second and third transistors, wherein a second terminal of said second transistor communicates with a first terminal of said third transistor, a first terminal of said second transistor communicates with said control terminal of said first transistor, and said second terminal of said second transistor communicates with said first end of said first capacitance means.

28. The feedback loop of claim 27 wherein said current biasing circuit comprises:
fourth, fifth, sixth, and seventh transistors each having a first terminal, a second terminal, and a control terminal, wherein said second terminals of said fourth and sixth transistors communicate with said first terminals of said fifth and seventh transistors, respectively, said control terminal of said fourth transistor communicates with said control terminal of said fifth transistor, said first terminal of said fourth transistor communicates with said control terminal of said sixth transistor, and said control terminal of said seventh transistor communicates with said first terminal of said sixth transistor.

29. The feedback loop of claim 28 wherein control terminals of said second and third transistors communicate with said control terminals of said sixth and seventh transistors, respectively.

30. The feedback loop of claim 28 wherein said current biasing means further comprises second capacitance means having a first end that communicates with said second terminal of said fourth transistor.

31. The feedback loop of claim 28 wherein said frequency boosting means comprises:
resistance means for providing resistance and having a first end that communicates with said first terminal of said fourth transistor and a second end that communicates with said control terminal of said fourth transistor; and
second capacitance means for providing a second capacitance and having a first end that communicates with said second end of said resistance means and a second end that communicates with said second terminal of said second transistor.

32. The feedback loop of claim 28 wherein said first, second, third, fourth, fifth, sixth, and seventh transistors are metal-oxide semiconductor field-effect transistors (MOSFETs).

33. The feedback loop of claim 31 wherein said resistance means is one of a standard fixed-value resistor, a nonlinear resistor, and a metal-oxide semiconductor (MOS) resistor.

34. The feedback loop of claim 28 further comprising first and second current means for providing current, wherein said first terminals of said fourth and sixth transistors communicate with said first and second current means for providing current, respectively.

35. A system comprising the feedback loop of claim 26 and further comprising an Ahuja compensation means for providing Ahuja compensation and including said first transistor and a second transistor, wherein a second terminal of said second transistor communicates with said control terminal of said first transistor.

36. The system of claim 35 wherein an input voltage of said system is applied to a control terminal of said second transistor and wherein an output voltage of said system is referenced from said first terminal of said first transistor.

37. The system of claim 35 wherein said Ahuja compensation means further comprises second and third capacitance means for providing capacitance, wherein a first end of said second capacitance means communicates with said control terminal of said first transistor and wherein said first end of said third capacitance means communicates with said first terminal of said first transistor.

38. The feedback loop of claim 26 further comprising first current means for providing current wherein said first terminal of said first transistor communicates with said first current means.

* * * * *

UNITED STATES PATENT AND TRADEMARK OFFICE
CERTIFICATE OF CORRECTION

PATENT NO. : 7,049,894 B1
APPLICATION NO. : 10/789306
DATED : May 23, 2006
INVENTOR(S) : Farbod Aram It is certified that error appears in the above-identified patent and that said Letters Patent is hereby corrected as shown below:

Column 5, Line 23　　　Delete "fixed-vale" and insert --fixed value--

Signed and Sealed this

Thirteenth Day of March, 2007

JON W. DUDAS
*Director of the United States Patent and Trademark Office*